(12) United States Patent
Imaeda

(10) Patent No.: US 6,613,599 B2
(45) Date of Patent: Sep. 2, 2003

(54) ELECTRO-OPTICAL DEVICE, METHOD OF MANUFACTURING ELECTRO-OPTICAL DEVICE, LIQUID CRYSTAL DEVICE, METHOD OF MANUFACTURING LIQUID CRYSTAL DEVICE AND ELECTRONIC APPARATUS

(75) Inventor: Chiaki Imaeda, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/901,480

(22) Filed: Jul. 9, 2001

(65) Prior Publication Data
US 2002/0149074 A1 Oct. 17, 2002

(30) Foreign Application Priority Data

Jul. 10, 2000 (JP) ........................................ 2000-208441
May 24, 2001 (JP) ........................................ 2001-155327

(51) Int. Cl.[7] ............................................. H01L 21/00
(52) U.S. Cl. ............................ 438/30; 438/31; 438/32; 349/149
(58) Field of Search ................................. 257/432, 431; 349/149–152; 438/30, 48, 65, 7, 16, 31, 32

(56) References Cited

U.S. PATENT DOCUMENTS 5,293,262 A * 3/1994 Adachi et al. ............... 349/149
5,527,628 A 6/1996 Anderson et al.
6,221,197 B1 * 4/2001 Mori et al. ............... 156/308.6
6,342,932 B1 * 1/2002 Terao et al. .................. 349/58

FOREIGN PATENT DOCUMENTS

JP 05-050286 3/1993

* cited by examiner

Primary Examiner—David Nelms
Assistant Examiner—Long Tran
(74) Attorney, Agent, or Firm—Harness, Dickey & Pierce, P.L.C.

(57) ABSTRACT

A method of manufacturing an electro-optical device is provided. The device includes an electro-optical panel, a first wiring substrate mounted to the electro-optical panel, a second wiring substrate connected to the first wiring substrate, and a frame arranged between the electro-optical panel and the second wiring substrate. The method comprises arranging a heat insulating layer between a connection region where the first wiring substrate is connected to the second wiring substrate and the frame, arranging a light; diffusing layer between the heat insulating layer and the frame, and applying heat to the connection region to conductively connect the first wiring substrate to the second wiring substrate.

16 Claims, 14 Drawing Sheets

(a)

(b)

(a)

(b)

(a)

(b)

ELECTRO-OPTICAL DEVICE, METHOD OF MANUFACTURING ELECTRO-OPTICAL DEVICE, LIQUID CRYSTAL DEVICE, METHOD OF MANUFACTURING LIQUID CRYSTAL DEVICE AND ELECTRONIC APPARATUS

BACKGROUND OF THE INVENTION

1. Technical Field of the Invention

The present invention relates to an electro-optical device, a method of manufacturing an electro-optical device, a liquid crystal device, a method of manufacturing a liquid crystal device and an electronic apparatus, and particularly to a structure and a manufacturing method for an electro-optical device comprising a wiring substrate connected to an electro-optical panel substrate.

2. Description of the Related Art

At present, liquid crystal devices are widely used for electronic apparatuses such as cellular telephones, potable electronic terminal units, etc. In many cases, a liquid crystal device is used for displaying information by a character, a numeral, a pattern, or the like.

A liquid crystal device generally comprises a pair of liquid crystal substrates each having an electrode formed on the inner side thereof, and a liquid crystal held between the pair of substrates so that the orientation state of the liquid crystal is controlled by controlling the voltage applied to the liquid crystal to modify light incident on the liquid crystal according to the liquid crystal orientation state. The liquid crystal device requires a liquid crystal driving IC, i.e., a semiconductor chip, for controlling the voltage applied to the liquid crystal, the IC being mounted directly on one of the liquid crystal substrates or indirectly thereon through a mounting structure such as a flexible wiring board, or a printed circuit board.

In connecting the liquid crystal driving IC indirectly to one of the liquid crystal substrates through the mounting structure, for example, the liquid crystal driving IC is mounted on a flexible printed board comprising a wiring pattern and electrode terminals to form the mounting structure which is then connected to one of the substrates of the liquid crystal device. In this case, the mounting structure can be connected to one of the substrates of the liquid crystal device by using solder.

In the above-described liquid crystal device, in some cases, a liquid crystal panel or a plastic frame functioning as a light guide for a back light is provided on the back side of the display surface of the liquid crystal substrate. In this case, the frame is possibly damaged by heating during soldering of the liquid crystal substrate and the mounting structure.

Particularly, it has recently been demanded to eliminate conventional lead-containing solder from electronic apparatuses in connection with environmental problems. In order to comply with this demand, various types of lead-free solder (binder alloys substantially not containing lead) have already been developed. However, conventional lead-containing solder has a melting point of about 183° C., while lead-free solder has a melting point of about 210 to 230° C. Therefore, the substitution of lead-free solder for conventional solder increases the occurrence probability of damage to the frame or deteriorates the degree of the damage to the frame because the melting point is increased. For these reasons, a conventional manufacturing process cannot be used as it is, necessitating a change of the manufacturing process in some cases.

Accordingly, the present invention has been achieved for solving the above problems, and an object of the present invention is to provide a structure and a manufacturing method capable of preventing thermal damage to a frame in an electro-optical device such as a liquid crystal device.

SUMMARY OF THE INVENTION

In order to achieve the object, in accordance with a first aspect of the present invention, an electro-optical device comprises an electro-optical panel substrate, a first wiring substrate mounted on the electro-optical panel substrate, a second wiring substrate connected to the first wiring substrate, and a frame arranged between the electro-optical panel substrate and the second wiring substrate, wherein the first wiring substrate is conductively connected to the second wiring substrate with a bonding metal, and a heat insulating layer is provided between the frame and the connection region between the first and second wiring substrates.

In the present invention, by providing the heat insulating layer between the connection region and the frame, heat transmission to the frame can be suppressed during conductive connection between the first and second wiring substrates with the bonding metal, thereby preventing damage such as thermal deformation or thermal deterioration of the frame. Also, providing the heat insulating layer prevents heat transmission from the connection region between the first and second wiring substrates to the frame to facilitate heating of the bonding metal, thereby facilitating the connecting work with the bonding metal and improving the quality of the bonded state of the connection region.

In accordance with a second aspect of the present invention, an electro-optical device comprises an electro-optical panel substrate, a plurality of first wiring substrates mounted on the electro-optical panel substrate, a second wiring substrate connected to the plurality of first wiring substrates, and a frame arranged between the electro-optical panel substrate and the second wiring substrate, wherein the plurality of first wiring substrates are conductively connected to the second wiring substrate with a bonding metal in different directions, and a heat insulating layer is provided between the frame and the connection regions between the first wiring substrates and the second wiring substrate.

In the present invention, since the plurality of first wiring substrates conductively connected to the second wiring substrate in different directions are provided, the work of conductively connecting at least one of the first wiring substrates to the second wiring substrate must be performed on the frame, and thus the heat insulating function of the heat insulating layer between the frame and the connection region becomes particularly effective.

In accordance with a third aspect of the present invention, an electro-optical device comprises an electro-optical panel substrate, a plurality of first wiring substrates mounted on the electro-optical panel substrate, a second wiring substrate connected to the plurality of first wiring substrates, and a frame arranged between the electro-optical panel substrate and the second wiring substrate, wherein the electro-optical panel substrate has a peripheral shape having a plurality of side edges, the plurality of first wiring substrates are conductively connected to the second wiring substrate with a bonding metal from the different side edges of the electro-optical panel substrate, and a heat insulating layer is provided between the frame and the connection regions between the first wiring substrates and the second wiring substrate.

In the present invention, since the plurality of first wiring substrates conductively connected to the second wiring substrate from different side edges of the electro-optical panel substrate are provided, the work of conductively connecting at least one of the first wiring substrates and the second wiring substrate must be performed on the frame, and thus the heat insulating function of the heat insulating layer between the frame and the connection region becomes particularly effective.

In accordance with a fourth aspect of the present invention, an electro-optical device comprises an electro-optical panel substrate, a plurality of first wiring substrates mounted on the electro-optical panel substrate, a second wiring substrate connected to the plurality of first wiring substrates, and a frame arranged between the electro-optical panel substrate and the second wiring substrate, wherein the first wiring substrates are conductively connected to the second wiring substrate with a bonding metal, the first wiring substrates or the second wiring substrate nearer to the frame than the connection regions between the first wiring substrates and the second wiring substrate has a thickness of about 50 μm or less, and a heat insulating layer is provided between the frame and the connection regions between the first wiring substrates and the second wiring substrate.

In the present invention, the first wiring substrates or the second wiring substrate nearer to the frame than the connection regions between the first wiring substrates and the second wiring substrate has a thickness of about 50 μm or less, and thus thermal deformation or thermal deterioration easily occurs in the frame due to heat of the work of conductive connection with the bonding metal. Therefore, by providing the heat insulating layer, thermal damage to the frame can be effectively decreased.

In the present invention, the bonding metal preferably comprises lead-free solder. Since the lead-free solder has a higher melting point than conventional lead-containing solder, the heat insulating layer is particularly effective.

In accordance with a fifth aspect of the present invention, an electro-optical device comprises an electro-optical panel substrate, a plurality of first wiring substrates mounted on the electro-optical panel substrate, a second wiring substrate connected to the plurality of first wiring substrates, and a frame arranged between the electro-optical panel substrate and the second wiring substrate, wherein the first wiring substrates are conductively connected to the second wiring substrate with lead-free solder, the first wiring substrates or the second wiring substrate nearer to the frame than the connection regions between the first wiring substrates and the second wiring substrate has a thickness of about 100 μm or less, and a heat insulating layer is provided between the frame and the connection regions between the first wiring substrates and the second wiring substrate.

With the substrates having a thickness of about 100 μm or more, damage such as thermal deformation or thermal deterioration easily occurs in the frame because the lead-free solder has a higher melting point than conventional solder. Therefore, in the present invention, the heat insulating layer is particularly effective, and with the substrates having a thickness of about 50 μm or less, a significant effect is obtained.

In the present invention, the lead-free solder preferably comprises an alloy selected from the group consisting of Sn—Ag—Cu system, Sn—Ag—Bi—Cu system, Sn—Ag system, Sn—Cu system, Sn—Bi system, and Sn—Zn system alloys.

In the present invention, the frame preferably comprises a synthetic resin material. From the viewpoint of manufacturing cost, the frame preferably comprises a synthetic resin material, for example, plastic. In this case, thermal deformation or thermal deterioration easily occurs due to heat transmitted from the connection regions, and thus the present invention particularly effective.

In the present invention, the heat insulating layer preferably has lower thermal conductivity than the material of the first or second wiring substrate arranged nearer to the frame than the connection regions. By using the heat insulating layer having lower thermal conductivity than the material of the substrates, the thickness of the heat insulating layer can be decreased to increase the degree of design freedom of a liquid crystal device and thin the entire device.

In the present invention, the heat insulating layer preferably contains a material selected from the group consisting of silicone rubber, polytetrafluoroethylene, polychlorotrifluoroethylene, and fluorocarbon rubber. All these materials have a good heat insulating property.

In the present invention, the heat insulating layer preferably has a bonding function. Since the connection portion of the first wiring substrate or the second wiring substrate is bonded to the frame with the heat insulating layer provided therebetween to eliminate the need to provide another fixing means and enable temporary fixing of the connection portion of the first wiring substrate or the second wiring substrate to the frame in the work of connecting the first wiring substrate to the second wiring substrate.

In the present invention, the heat insulating layer preferably contains a thermosetting resin. With the heat insulating layer containing the thermosetting resin, the heat insulating layer can be cured by heat receivable during the connection between the first wiring substrate and the second wiring substrate, thereby improving the connection operation and firmly fixing the connection portion of the first wiring substrate or the second wiring substrate to the frame. Furthermore, the connection portion of the first wiring substrate or the second wiring substrate can be temporary fixed to the frame by using adhesiveness before curing by heat.

In the present invention, the heat insulating layer is preferably formed to have the function to reflect light to the electro-optical panel substrate side. With the heat insulating layer having the light reflecting function, the heat insulating layer can be used as a portion of illumination means such as a back, thereby eliminating the need to provide another reflecting layer.

In the present invention, the frame has a light guide function in some cases. In the case of the frame having a light guide function, thermal deformation or thermal deterioration in the frame influences the function to illuminate a liquid crystal panel. Therefore, the present invention capable of preventing thermal damage to the frame is particularly effective.

A liquid crystal device of the present invention comprises any one of the above-described electro-optical devices of the present invention, wherein the electro-optical panel substrate serves as a liquid crystal panel substrate.

A method of manufacturing an electro-optical device comprising an electro-optical panel substrate, a first wiring substrate mounted on the electro-optical panel substrate, a second wiring substrate connected to the first wiring substrate, and a frame arranged between the electro-optical panel substrate and the second wiring substrate of the present invention comprises applying heat to the connection region between the first wiring substrate and the second wiring substrate with a heat insulating layer provided between the connection region and the frame to conductively connect the first wiring substrate to the second wiring substrate.

In the present invention, in conductively connecting the first wiring substrate to the second wiring substrate with a bonding metal, heating to a high temperature is required for melting the bonding metal, and thus the present invention is particularly effective.

The present invention is particularly effective when the first wiring substrate or the second wiring substrate provided nearer to the frame than the connection region has a thickness of about 50 µm or less.

In the present invention, the use of lead-free solder as the bonding metal exhibits a significant effect because the lead-free solder has a higher melting point than conventional lead-containing solder.

In the present invention, a significant effect is obtained particularly when the first wiring substrate or the second wiring substrate provided nearer to the frame than the connection region has a thickness of about 100 µm or less.

In the present invention, the lead-free solder preferably comprises an alloy selected from the group consisting of Sn—Ag—Cu system, Sn—Ag—Bi—Cu system, Sn—Ag system, Sn—Cu system, Sn—Bi system, and Sn—Zn system alloys.

In the present invention, the frame preferably comprises a synthetic resin material.

In the present invention, the heat insulating layer preferably has lower thermal conductivity than the base material of the first or second wiring substrate arranged nearer to the frame than the connection region.

In the present invention, the heat insulating layer preferably contains a material selected from the group consisting of silicone rubber, polytetrafluoroethylene, polychlorotrifluoroethylene, and fluorocarbon rubber.

In the present invention, the second wiring substrate is preferably bonded to the frame by the heat insulating layer which receives heat during conductive connection between the first wiring substrate and the second wiring substrate. By bonding the second wiring substrate to the frame during conductive connection, another work of maintaining the second wiring substrate to the frame can be made unnecessary.

In the present invention, during conductive connection between the first wiring substrate and the second wiring substrate, the heat insulating layer is preferably thermally cured by heating to bond the second wiring substrate to the frame.

In the present invention, in some cases, a plurality of the first wiring substrates is connected to the second wiring substrate in different directions.

In the present invention, in some cases, a plurality of the first wiring substrates are connected to the second wiring substrate from different side edges of the second wiring substrate having a peripheral shape having a plurality of side edges.

In the present invention, the heat insulating layer is preferably removed after conductive connection between the first wiring substrate and the second wiring substrate. This removal of the heat insulating layer after conductive connection enables free selection of the material and thickness of the heat insulating layer of the liquid crystal device. Also, the heat insulating layer can be repeatedly used many times to decrease the manufacturing cost.

In the present invention, as the heat insulating layer, a layer having the function to reflect light to the electro-optical panel substrate side is preferably used.

As the heat insulating layer, a layer having the function to scatter light to the electro-optical panel substrate side is preferably used.

As the frame, a frame having a light guide function is preferably used.

The method of manufacturing a liquid crystal device of the present invention is the above-described method of manufacturing an electro-optical device, wherein the electro-optical panel substrate serves as a liquid crystal panel.

An electronic apparatus of the present invention comprises any one of the above-described electro-optical devices, and control means for controlling the electro-optical device.

An electronic apparatus of the present invention comprises the above-described liquid crystal device, and control means for controlling the liquid crystal device.

DETAILED DESCRIPTION OF THE PREFERRED EMBODIMENTS

An electro-optical device, a method of manufacturing an electro-optical device, a liquid crystal device, a method of manufacturing a liquid crystal device and an electronic apparatus in accordance with embodiments of the present invention will be described in detail below with reference to the attached drawings.

Figure 1:
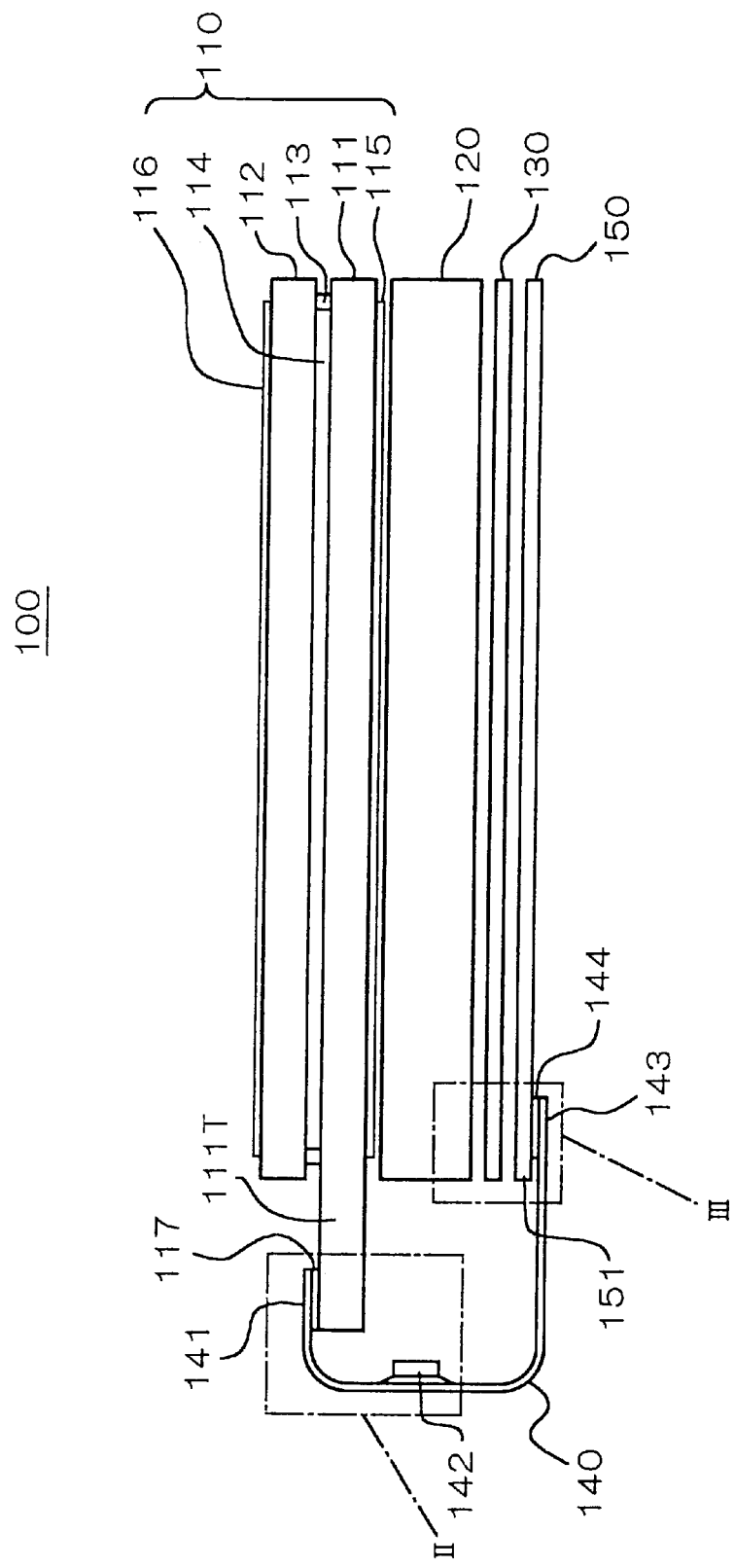
FIG. 1 is a schematic side view showing the schematic structure of a liquid crystal device according to a first embodiment of the present invention.
Figure 2:
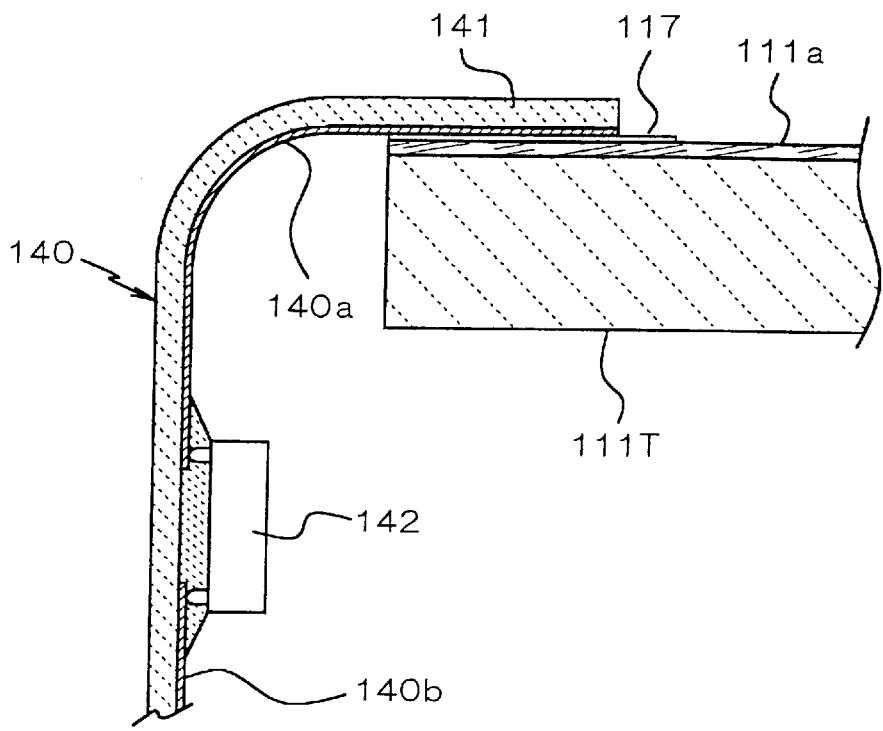
FIG. 2 is an enlarged partial sectional view showing the structure in the region II shown in FIG. 1.
Figure 3:
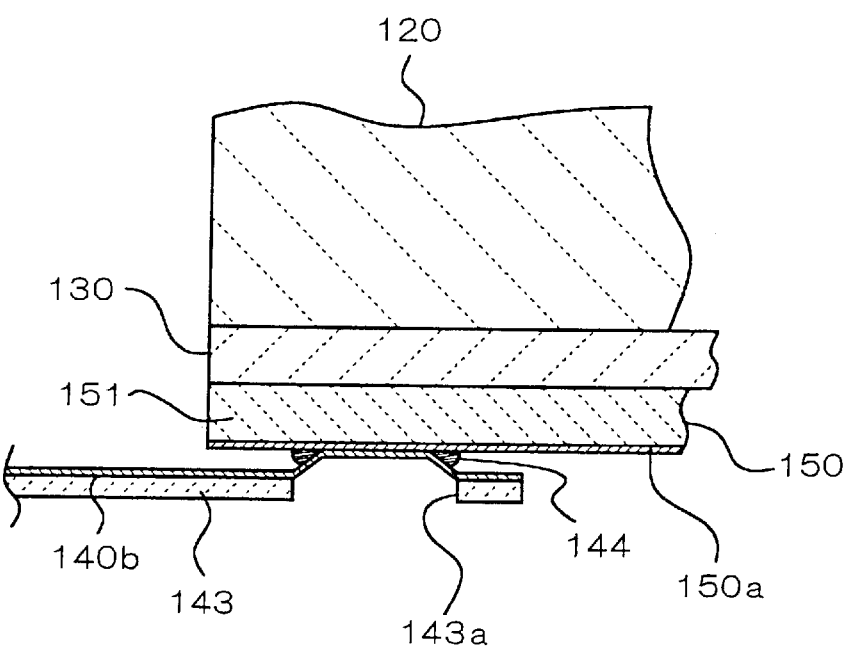
FIG. 3 is an enlarged partial sectional view showing the structure in the region III shown in FIG. 1.
Figure 4:
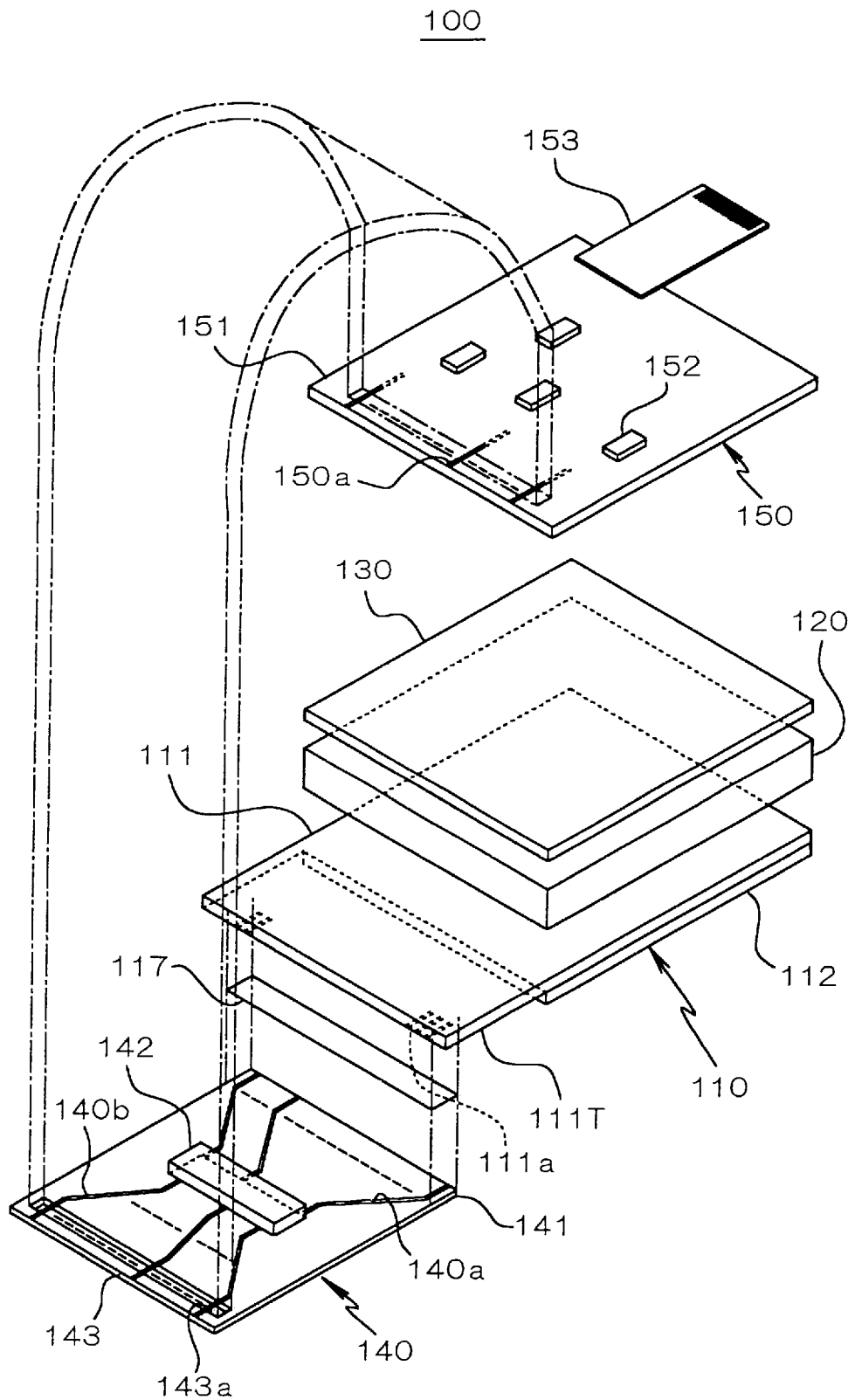
FIG. 4 is an exploded perspective view showing the structure of the first embodiment.

FIG. 1 is a schematic side view illustrating the structure of a liquid crystal device 100 in accordance with a first embodiment of the present invention, FIG. 2 is an enlarged partial sectional view illustrating the region II shown in FIG. 1, FIG. 3 is an enlarged partial sectional view illustrating the region III shown in FIG. 1, and FIG. 4 is an exploded perspective view of the liquid crystal device 100. In FIG. 4, the liquid crystal device 100 shown in FIGS. 1 to 3 is shown upside down.

As shown in FIG. 1, the liquid crystal device 100 comprises an electro-optical panel in the form of a liquid crystal panel 110, a plastic frame 120 arranged to overlap with the liquid crystal panel 110, a light diffusing layer 130 arranged to overlap with the frame 120, a first wiring substrate in the form of a flexible wiring substrate 140 mounted on the liquid crystal panel 110, and a second wiring substrate in the form of a circuit wiring substrate 150 arranged to be connected to the flexible wiring substrate 140 and overlap with the light diffusing layer 130.

The liquid crystal panel 110 comprises a first substrate 111 and a second substrate 112 both of which are made of glass, plastic, or the like, and combined together with a sealing material 113, a liquid crystal 114 being sealed in the space between both substrates. The first substrate 111 comprises a substrate projected portion 111T which is projected outward from the external shape of the second wiring substrate 112. Also, polarizers 115 and 116 are attached to the outer surfaces of the first substrate 111 and the second substrate 112, respectively.

Although not shown in the drawing, transparent electrodes made of a transparent conductor such as ITO (Indium Tin Oxide) or the like are respectively formed on the internal surface (the surface facing the second substrate 112) of the first substrate 111 and the internal surface (the surface facing the first substrate 111) of the second substrate 112. As shown in FIGS. 2 and 4, a plurality of wirings 111a are formed on the surface of the substrate projected portion 111T at the same time the transparent electrodes are formed on the first substrate 111 so that some of the wirings are conductively connected to the transparent electrodes on the first substrate 111, the other wirings being conductively connected to the transparent electrodes on the second substrate 112 through vertical conductive portions (for example, comprising an anisotropic conductor partially provided, or a sealing material containing conductive particles). In the drawings, the wirings and the wiring patterns formed in other portions are emphasized by thick lines appropriately decreased in number.

The frame 120 is formed by, for example, integral molding of a synthetic resin material such as an acrylic resin, a polycarbonate resin, or the like. Although the frame 120 basically functions as a support member for supporting the liquid crystal panel 110 or a support member for supporting the circuit wiring substrate 150, the frame 120 may have the holding function to hold the liquid crystal panel 110 or the circuit wiring substrate 150. The frame 120 may further function as a light guide serving as a portion of a back light arranged at the back (opposite to the observation side of the liquid crystal panel 110) of the liquid crystal panel 110.

Although the frame 120 is simply shown as a parallel plate in the drawings, the frame 120 may have a shape comprising a receiving recessed portion for receiving the liquid crystal panel or the circuit wiring substrate, a positioning frame, or the like. In the case of the frame 120 further functioning as the light guide, a light guide (LED or the like) is arranged, for example, opposite to the end surface of the frame 120, for introducing light into the frame 120.

The light diffusing layer 130 has the function to scatter light basically emitted from the side of the frame 120 which is opposite to the liquid crystal panel side thereof, and return the light to the frame 120. However, in this embodiment, the light diffusing layer 130 also functions as a heat insulating layer between the circuit wiring substrate 150 and the frame 120. The light diffusing layer 130 may comprise a film bonded to the frame 120 or a separate sheet or sheet-shaped member. In this embodiment, as the constituent material of the light diffusing layer 130, a material having relatively a good heat insulation property, such as silicone rubber, a fluororesin (polytetrafluoroethylene, polychlorotrifluoroethylene, or the like), fluorocarbon rubber (a copolymer of vinylidene fluoride and hexafluoropropylene, or the like) can be used. As such a material having a good heat insulation property (a material having low thermal conductivity), a material having a higher heat insulating property (lower thermal conductivity) than the insulating base material of the circuit wiring substrate 150 can be used.

The flexible wiring substrate 140 has a wiring pattern including the wirings 140a and 140b shown in FIGS. 2 to 4 which are made of a conductor such as Cu or the like, and which are formed on the surface of an insulating base material made of a resin such as polyimide or the like. The wiring pattern may be fixed to the insulating base material through an adhesive layer or by using a deposition method such as a sputtering method, a roll coating method, or the like. In the flexible wiring substrate 140, a plurality of wirings 140a are extended from an output terminal 141, which is formed at one end of the flexible wiring substrate 140, and conductively connected to a liquid crystal driving IC 142 mounted on the flexible wiring substrate 140 near the center thereof. The liquid crystal driving IC 142 is also conductively connected to a plurality of wirings 140b which are extended to an input terminal 143 formed at the other end of the flexible wiring substrate 140. The flexible wiring substrate 140 generally has a thickness of about 10 to 30 μm.

On the flexible wiring substrate 140, the liquid crystal driving IC 142, a chip part, etc. are mounted by using an anisotropic conductive film or the like to form a so-called COF (Chip On Film) mounting structure. Alternatively, the liquid crystal driving IC 142 is mounted on the substrate by gang bonding using Au—Sn eutectic bonding or the like to form a TAB (Tape Automated Bonding) system mounting structure.

The circuit wiring substrate 150 has a wiring pattern comprising a plurality of wirings 150a shown in FIGS. 3 and 4, which are made of a conductor such as Cu or the like, and which are formed on the surface of an insulating base material comprising a glass epoxy resin formed by impregnating a core of glass fibers or glass cloth with an epoxy resin, a phenolic resin, a polyimide resin, or the like. The wiring pattern may be fixed to the insulating base material through an adhesive layer or by using a deposition method such as a sputtering method, a roll coating method, or the like. The wirings 150a are arranged on an output terminal 151 formed at an end of the circuit wiring substrate 150 to extend into the substrate 150. On the circuit wiring substrate 150, electronic parts 152 such as IC, chip parts, etc. are mounted. Also, a flexible wiring substrate 153 is mounted on the circuit wiring substrate 150 so that a supply voltage and a control signal are input from the outside through the flexible wiring substrate 153. In some cases, the flexible wiring substrate 153 is soldered to the body of the circuit wiring substrate 150.

The insulating base material of the circuit wiring substrate 150 may have a thickness of about one hundred to several hundreds μm. However, in this embodiment, the base material having a thickness of about 100 μm is preferably used for decreasing the thickness of the liquid crystal device, and the base material having a thickness of less than 100 μm, for example about 75 μm or 50 μm, may be used.

In this embodiment, the plurality of wirings 111a extended to the substrate projected portion 111T of the liquid crystal panel 110 are respectively conductively connected to the plurality of wirings 140a arranged on the output terminal 141 of the flexible wiring substrate 140 through an anisotropic conductive film 117. The anisotropic conductive film 117 is heated under pressure applied to the output terminal 141 of the flexible wiring substrate 140 on the substrate projected portion 111T to provide conductive anisotropy substantially having conductivity only in the thickness direction. Also, the input terminal 143 of the flexible circuit substrate 140 is mounted on the output terminal 151 of the circuit wiring substrate 150 so that the terminals of the wirings 140b of the input terminal 143 are conductively connected to the terminals of the wirings 150a at the output terminal 151 through lead-free solder 144.

The lead-free solder 144 comprises a low-melting-point alloy, for example, such as a Sn—Ag—Cu system alloy, a Sn—Ag—Bi—Cu system alloy, a Sn—Ag system alloy, a Sb—Cu system alloy, a Sn—Bi system alloy, a Sn—Zn system alloy, or the like. More specifically, an alloy containing 0.5 to 5.0 wt % of Ag, 0.5 to 5.0 wt % of Cu and the balance composed of Sn, an alloy containing 0.5 to 5.0 wt % of Ag, 0.5 to 5.0 wt % of Cu, 0.5 to 2.0 wt % of Bi, and the balance composed of Sn can be used. Such lead-free solder has a melting point of about 210 to 230° C.

As shown in FIG. 3, a slit 143a is provided in the input terminal 143 of the flexible wiring substrate 140, in which the insulating base material is removed, and the exposed terminals of the wirings 140b are bonded to the terminals of the wirings 150a arranged in the output terminal 151 of the circuit wiring substrate 150 with the lead-free solder 144.

Each of the wirings basically comprises a Cu pattern and has a terminal having a structure in which the surface of the Cu pattern is coated with a thin film (plated film) of Au or Sn, if required, with a Ni layer provided therebetween.

Figure 5:
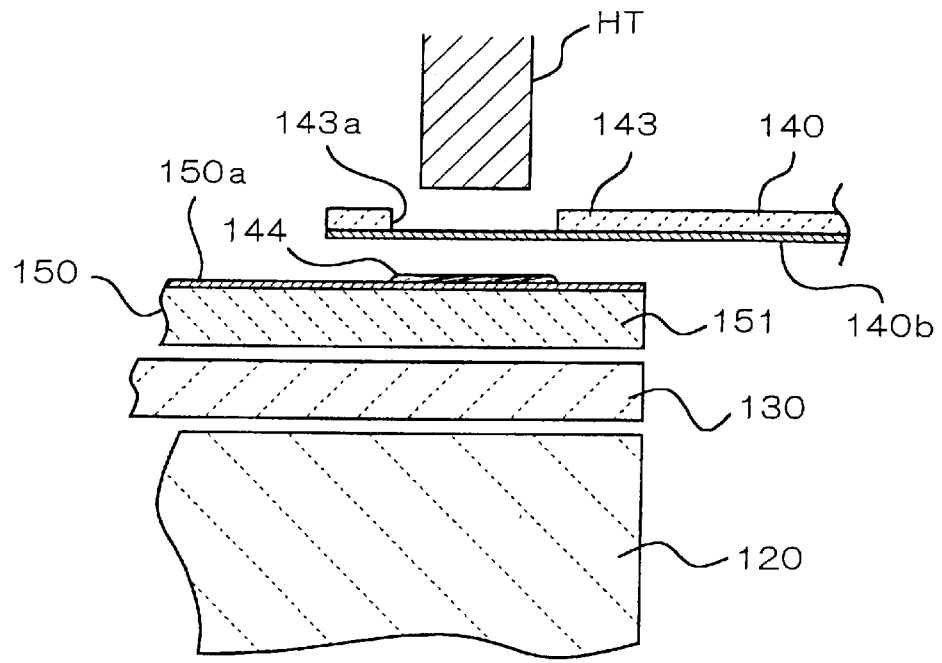
FIGS. 5(a) and (b) are drawings respectively illustrating the connecting steps in a method of manufacturing the liquid crystal device of the first embodiment.
Figure 5:
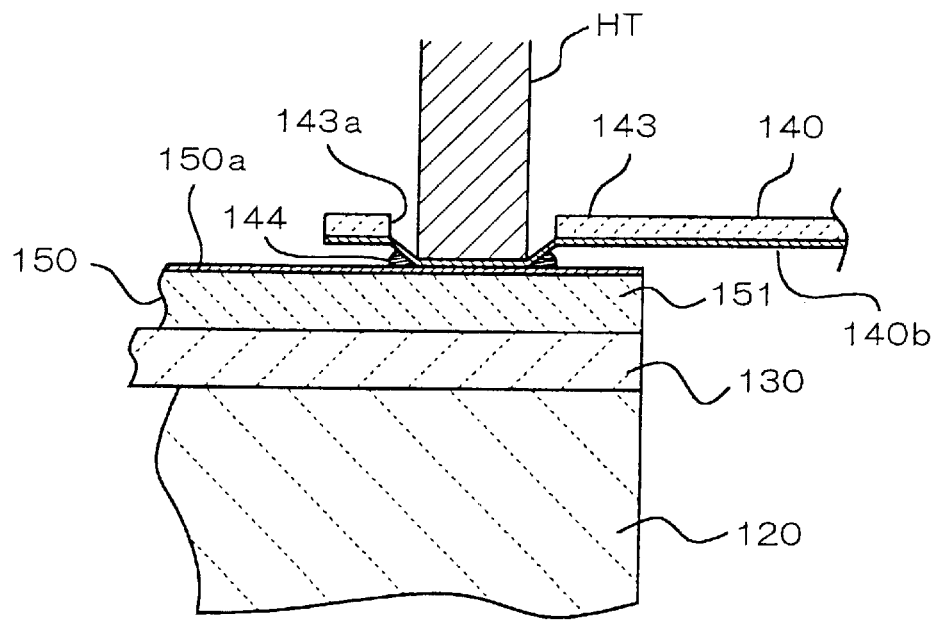

Next, the step of conductively connecting the flexible wiring substrate 140 to the circuit wiring substrate 150 is described below with reference to FIG. 5. FIG. 5(a) is an enlarged partial sectional view showing the state before soldering, and FIG. 5(b) is an enlarged partial sectional view showing the state during soldering.

As shown in FIG. 5(a), the lead-free solder 144 is previously coated on one of the input terminal 143 of the flexible wiring substrate 140 and the output terminal 151 of the circuit wiring substrate 150 (this figure shows an example in which the lead-free solder 144 is coated on the circuit wiring substrate 150), and the flexible wiring substrate 140 and the circuit wiring substrate 150 are aligned so that the input terminal 143 and the output terminal 151 are opposed to each other. As shown in FIG. 5(b), then a pressure bonding member HT is pressed on the terminals of the wirings 140b exposed in the slit 143a from the flexible wiring substrate 140 side to melt the lead-free solder 144 while pressing the terminals of the wirings 140b on the terminals of the wirings 150a of the circuit wiring substrate 150. Then, the pressure bonding member HT is released to solidify the lead-free solder 144, thereby fixing the wirings 140b and 150a in a state of conductive connection.

In the above step, the pressure bonding member HT may be driven by an automated apparatus, or the pressure bonding member HT may be pressed by a manual operation.

In this embodiment, the temperature of heating by the pressure bonding member HT is set to a high temperature because of use of the lead-free solder 144 having a higher melting point than conventional solder. Therefore, the lead-free solder 144 has great thermal influence on the frame during melting. However, this embodiment uses the above-described material having a high heat insulation property as the light diffusing layer 130 arranged between the frame 120 and the circuit wiring substrate 150, thereby causing less transmission of heat of the pressure bonding member HT to the frame 120. As a result, thermal deformation or thermal deterioration of the frame 120 can be prevented.

The light diffusing layer 130 functioning as the heat insulating material as described above can be formed by holding a light diffusing sheet, which is previously formed in a sheet before the connection step, between the frame 120 and the circuit wiring substrate 150. Alternatively, the light diffusing layer held between the frame 120 and the circuit wiring substrate 150 may be previously provided, or the light diffusing layer 130 may be deposited (coated) on one of the surface (the surface on the circuit wiring substrate 150 side) of the frame 120 and the surface (the surface on the frame 120 side) of the circuit wiring substrate 150.

The light diffusing layer 130 can be formed by using a material containing a thermosetting resin. In this case, the material containing a thermosetting resin is cured by heat of the pressure bonding member HT to allow the material to also function as an adhesive layer for bonding the frame 120 and the circuit wiring substrate 150 together. Furthermore, the material containing a thermosetting resin generally has adhesiveness before curing, and thus the frame 120 and the circuit wiring substrate 150 can be temporarily fixed together by using the adhesiveness before the connection step. Therefore, another means (jig or the like) need not be provided for temporary fixing for the connection step. Besides the material containing a thermosetting resin, a heat insulating material having adhesiveness can also be used to exhibit the temporary fixing effect and a fixing effect in the subsequent step.

Although the light diffusing layer 130 has both the optical function and the heat insulating function, a heat insulating material without the optical function may be arranged between the frame 120 and the circuit wiring substrate 150. In this case, with the frame 120 functioning as a light guide, the light diffusing layer 130 may be separately arranged between the frame 120 and the heat insulating material, or the frame 120 may be formed to independently achieve a light guide function. For example, in the latter case, a light scattering layer or light reflecting layer comprising a printed layer or an uneven structure can be formed on the surface of the frame on the circuit wiring substrate 150 side thereof, or another light reflecting plate (light scattering plate) can be arranged. Like the light diffusing layer 130, a heat insulating material which can function as an adhesive layer may be used.

The heat insulating material, which does not function as the light diffusing layer, may be arranged at least between the connection region (the region of connection with solder) between the flexible wiring substrate 140 and the circuit wiring substrate 150 and the frame 120. Therefore, unlike in the example shown in the drawing, the heat insulating material need not be present over the entire region where the frame 120 and the circuit wiring substrate 150 are opposed to each other. This is true for a case in which the heat insulating material also functions as the adhesive layer because the adhesive function does not deteriorate while the bonding area is decreased.

Although, in this embodiment, the light diffusing layer 130 having the heat insulating function is arranged between the connection region between the flexible wiring substrate 140 and the circuit wiring substrate 150 and the frame 120, the heat insulating function of the heat insulating material is particularly effective when the thickness of the insulating base material of the circuit wiring substrate 150 provided nearer to the frame 120 side than the connection region has a thickness of about 100 μm or less. Also, in this embodiment, even when the insulating base material has a thickness of about 50 μm or less, manufacture can be sufficiently carried out.

Although, in this embodiment, the heat insulating material functioning as the light diffusing layer is described, a heat insulating material functioning as a light reflecting layer can also be used. In this case, the heat insulating material may comprise a material having high reflectance, or a reflecting layer may be formed on the heat insulating material.

Figure 6:
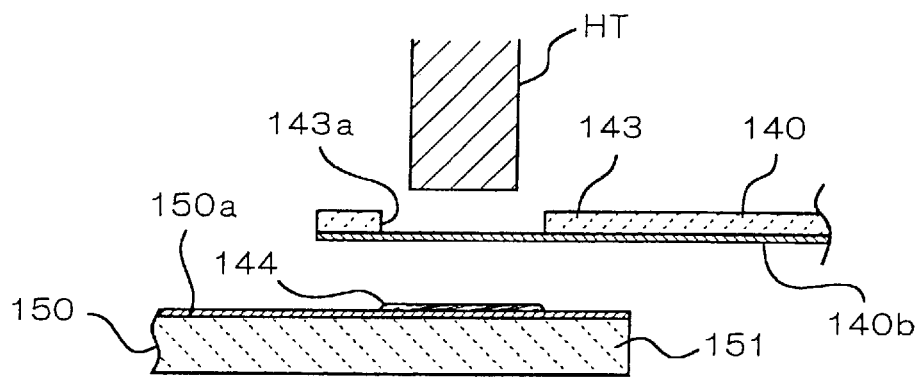
FIGS. 6(a) and (b) are drawings respectively illustrating the connecting steps in a method of manufacturing a liquid crystal device according to a second embodiment of the present invention.
Figure 6:
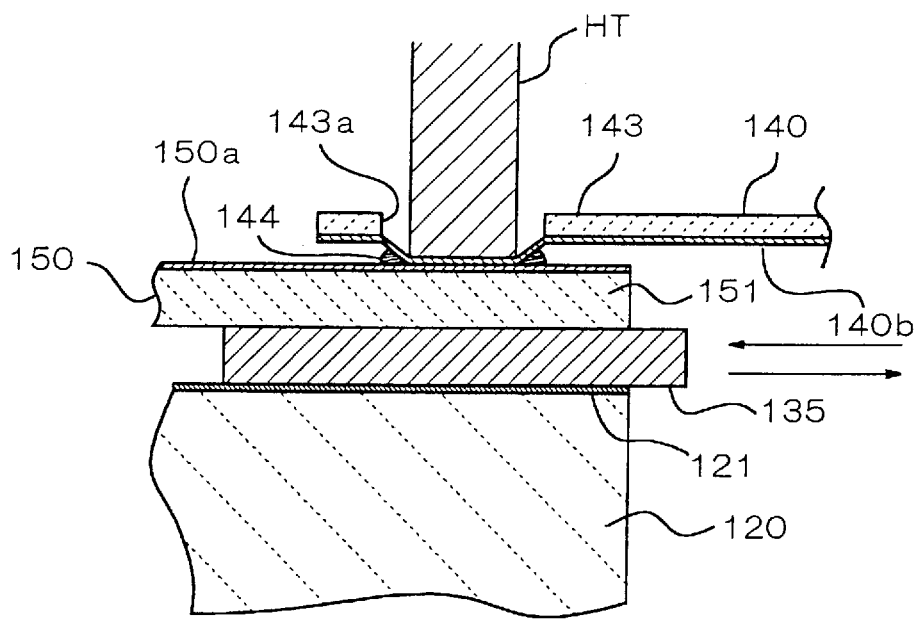

A second embodiment of the present invention will be described below. In this embodiment, the basic structure of a liquid crystal device is substantially the same as the first embodiment, and thus the same portions as the first embodiment are denoted by the same reference numerals and are not described below. FIG. 6(a) is an enlarged sectional view showing the state of the liquid crystal device of the second embodiment before soldering, and FIG. 6(b) is an enlarged sectional view showing the state during soldering.

This embodiment is different from the first embodiment in that a light reflecting layer (light scattering layer) 121 is arranged in place of the light diffusing layer 130. As the light reflecting layer 121, for example, a synthetic resin such as polyethylene terephthalate or the like, or a metal layer of aluminum or the like can be used. For example, by using a white resin plate as the light reflecting layer 121, light emitted from the frame 120 can be scattered to the liquid crystal panel 110. The sheet-shaped (plate-shaped) light reflecting layer 121 may be arranged, or the light reflecting layer 121 may be deposited on the surface (the surface on the circuit wiring substrate 150 side) of the frame 120.

In this embodiment, the lead-free solder 144 is previously pre-coated on one of the input terminal 143 of the flexible circuit substrate 140 and the output terminal 151 of the circuit wiring substrate 150. FIG. 6(a) shows the case in which the lead-free solder 144 is coated on the terminal surfaces of the wirings 150a at the output terminal 151 of the circuit wiring substrate 150. The material of the lead-free solder 144 is the same as the above-described first embodiment.

Next, as shown in FIG. 6(b), a heat insulating material 135 is inserted between the frame 120 and the circuit wiring substrate 150. This embodiment can use as the constituent material of the heat insulating material 135 a material having relatively good heat insulating property such as silicone rubber, fluororesin (polytetrafluoroethylene, polychlorotrifluoroethylene, or the like), fluorocarbon rubber (copolymer of vinylidene fluoride and hexafluoropropylene, or the like). Such a material having a good heat insulating property (a material having low thermal conductivity) preferably has a higher heat insulating property (lower thermal conductivity) than the insulating base material of the circuit wiring substrate 150.

In this embodiment, the thickness of the heat insulating material 135 is not restricted by another function (for example, a light diffusing function or a light reflecting function), and thus the material having low thermal conductivity is not necessarily used as long as a sufficient heat insulating effect can be obtained due to the thickness thereof. However, the space between the frame 120 and the circuit wiring substrate 150 must be minimized in order to make the liquid crystal device compact, and thus the thin heat insulating material 135 is preferably formed by using the above material to comply with the small space between the frame 120 and the circuit wiring substrate 150.

In the state in which the heat insulating material 135 is arranged between the frame 120 and the circuit wiring substrate 150, the terminals of the wirings 140b exposed in the slit 143a at the input terminal 143 of the flexible wiring substrate 140 are pressed on the lead-free solder 144 under heating by the same method as the first embodiment using the pressure bonding member HT. As a result, the lead-free solder 144 is melted with the wirings 140b and the wirings 150a press-bonded together, and then solidified by removing the pressure bonding member HT to fix the wirings in a state of conductive connection.

After the flexible wiring substrate 140 is completely connected to the circuit wiring substrate 150 as described above, the heat insulating material 135 is removed by drawing it from the space between the frame 120 and the circuit wiring substrate 150. Then, the circuit wiring substrate 150 is mounted on the frame 120 by any one of various methods such as bonding, engagement, or the like according to demand.

The heat insulating material 135 may be arranged at least between the connection region (the region of connection with solder) between the flexible wiring substrate 140 and the circuit wiring substrate 150 and the frame 120, and thus the heat insulating material 135 may be arranged over the entire region where the frame 120 and the circuit wiring substrate 150 are opposed to each other, or may be partially arranged between the frame 120 and the circuit wiring substrate 150 as in the example shown in the drawing. This applies to a case in which the heat insulating material also functions as the adhesive layer because the bonding area is decreased, while the bonding function does not deteriorate. In this case, a small sheet can be used as the heat insulating material 135 to facilitate insertion into and removal from the space between the frame 120 and the circuit wiring substrate 150 in the manufacturing process.

In this embodiment, since the heat insulating material 135 is removed after soldering, a material having an excellent heat insulating effect can be freely selected as the heat insulating material 135 regardless of the function of the liquid crystal device. Also, the thickness of the heat insulating material 135 can be appropriately selected in consideration of the heat insulating effect and workability. Furthermore, the heat insulating material 135 can be repeatedly used for many liquid crystal devices, and thus even when an expensively heat insulating material is used, the manufacturing cost can be decreased.

A layer containing a thermosetting resin may be provided between the frame 120 and the circuit wiring substrate 150 instead of the heat insulating material 135 to form a heat insulating layer. Such a layer can be formed by coating a material containing a thermosetting resin on the frame 120 or the circuit wiring substrate 150. In this case, the layer can be caused to function as a heat insulating layer during soldering, and can be removed by separating the thermally cured layer after soldering.

By using an adhesive material as the heat insulating material 135, the frame 120 and the circuit wiring substrate 150 can be temporarily fixed due to the adhesiveness of the material before soldering. The adhesiveness permitting temporary fixing of the frame 120 and the circuit wiring substrate 150 can be imparted to the layer containing a thermosetting resin.

Figure 7:
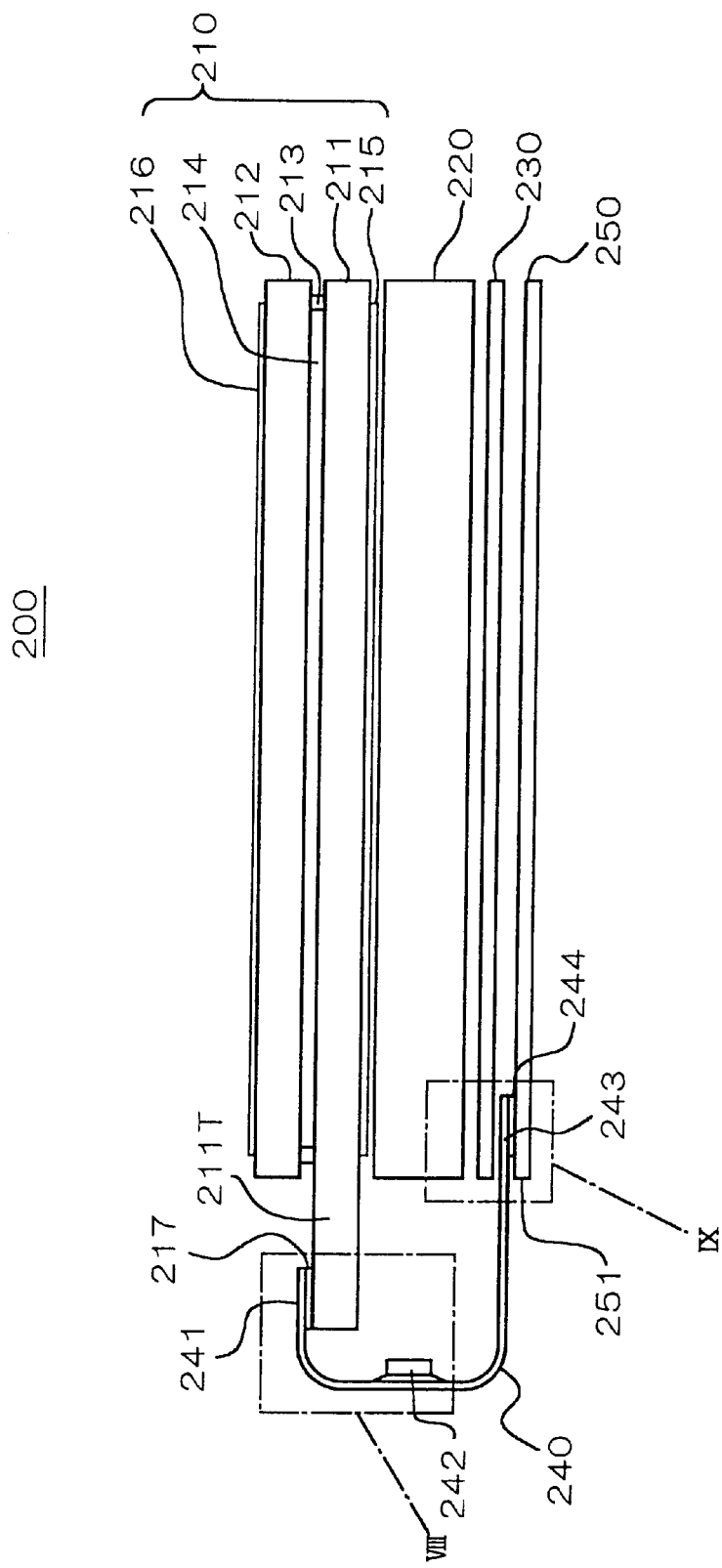
FIG. 7 is a schematic side view showing the schematic structure of a liquid crystal device according to a third embodiment of the present invention.
Figure 8:
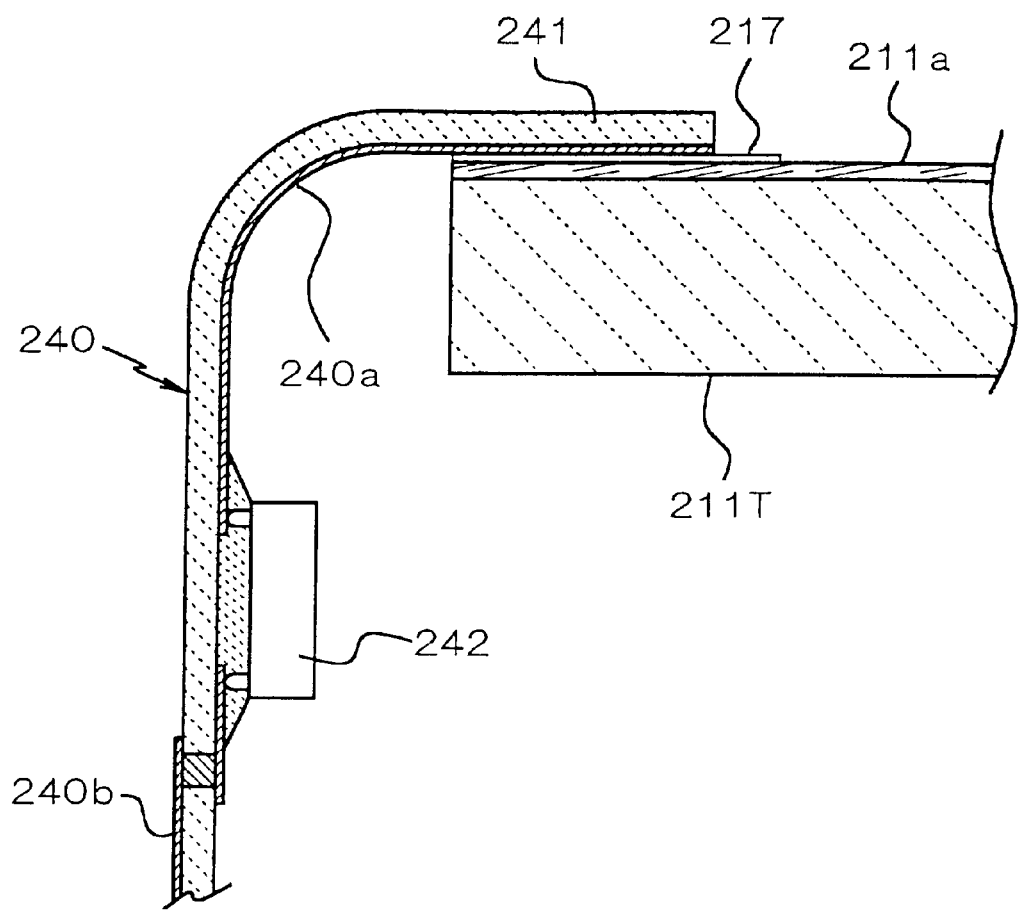
FIG. 8 is an enlarged partial sectional view showing the structure in the region VIII shown in FIG. 7.
Figure 9:
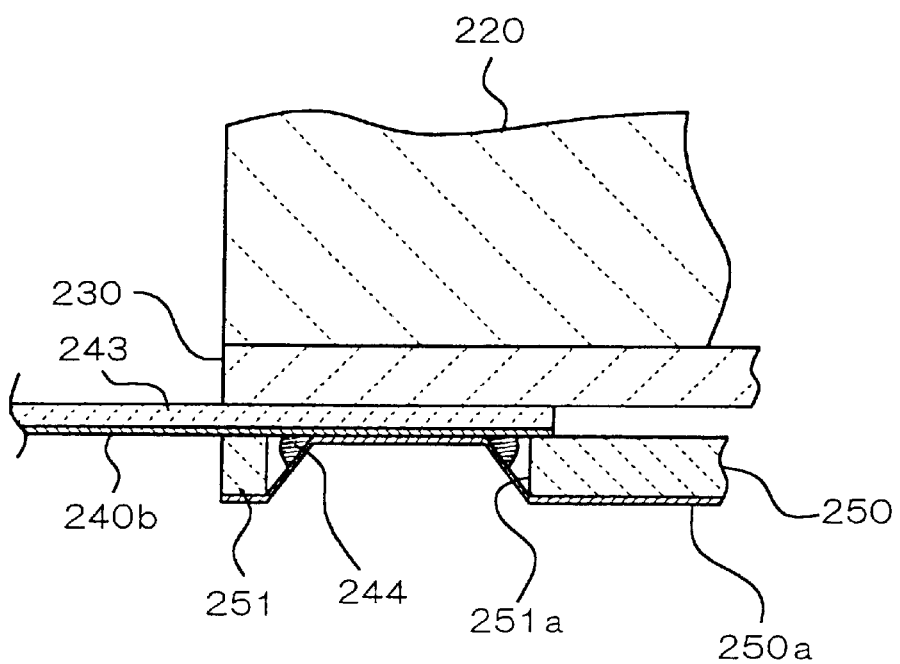
FIG. 9 is an enlarged partial sectional view showing the structure in the region IX shown in FIG. 7.

The construction of a third embodiment of the present invention will be described below with reference to FIGS. 7 to 9. FIG. 7 is a side view showing the schematic structure of a liquid crystal device 200 according to the third embodiment, FIG. 8 is an enlarged partial sectional view showing the region VIII shown in FIG. 7, and FIG. 9 is an enlarged partial sectional view showing the region IX shown in FIG. 7.

As shown in FIG. 7, the liquid crystal device 200 comprises a liquid crystal panel 210, a plastic frame 220 arranged to overlap with the liquid crystal panel 210, a light diffusing layer 230 arranged to overlap with the frame 220, a flexible wiring substrate 240 mounted on the liquid crystal panel 210, and a circuit wiring substrate 250 arranged to be connected to the flexible wiring substrate 240 and overlap with the light diffusing layer 230.

The liquid crystal panel 210 comprises a first substrate 211, a second substrate 212, a sealing material 213 and a liquid crystal 214, which are the same as the first embodiment. The frame 220 and the light diffusing layer 230 are the same as the first embodiment. A description of these members is thus omitted.

In this embodiment, an output terminal 241 of the flexible wiring substrate 240 is mounted onto a substrate projected portion 211T of the first substrate through an anisotropic conductive film 217. As shown in FIG. 8, a plurality of wirings 211a are formed to be led to the substrate projected portion 211T in the same manner as the first embodiment. Then, the anisotropic conductive film 217 is adhered to the terminals at the ends of the wirings 211a, and the output terminal 241 of the flexible wiring substrate 240 is thermally bonded to the anisotropic conductive film 217 under compression to conductively connect the plurality of wirings 240a having the terminals at the output terminal 241 to the wirings 211a.

A liquid crystal driving IC 242 is mounted on the flexible wiring substrate 240. The liquid crystal driving IC 242 is conductively connected to the wirings 240a, as well as the wirings 240b extending on the surface of the insulating base material of the flexible wiring substrate 240 in the direction opposite to the wirings 240a.

As shown in FIG. 9, the terminals of the wirings 240b are formed on an input terminal 243 of the flexible wiring substrate 240. The terminals of the wirings 240b are conductively connected to the terminals of the wirings 250a provided on the output terminals 251 of the circuit wiring substrate 250 from the light diffusing layer 230 side through lead-free solder 244. The output terminal 251 of the circuit wiring substrate 250 has a slit 251a in which the wirings 250a are exposed to form the terminals.

Figure 10:
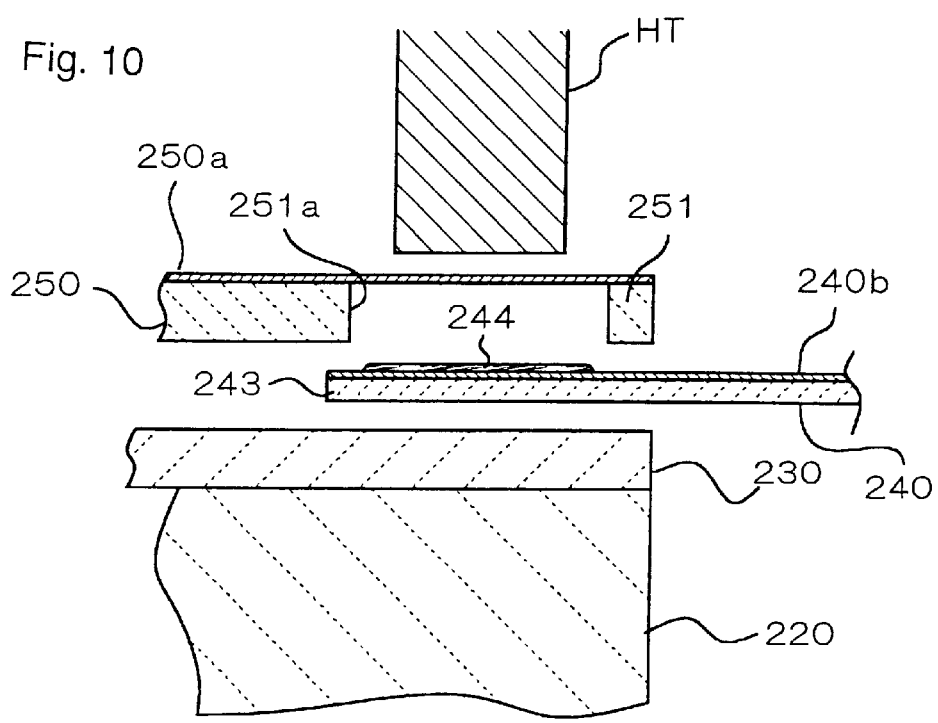
FIGS. 10(a) and (b) are drawings respectively illustrating the connecting steps in a method of manufacturing the liquid crystal device of the third embodiment.
Figure 10:
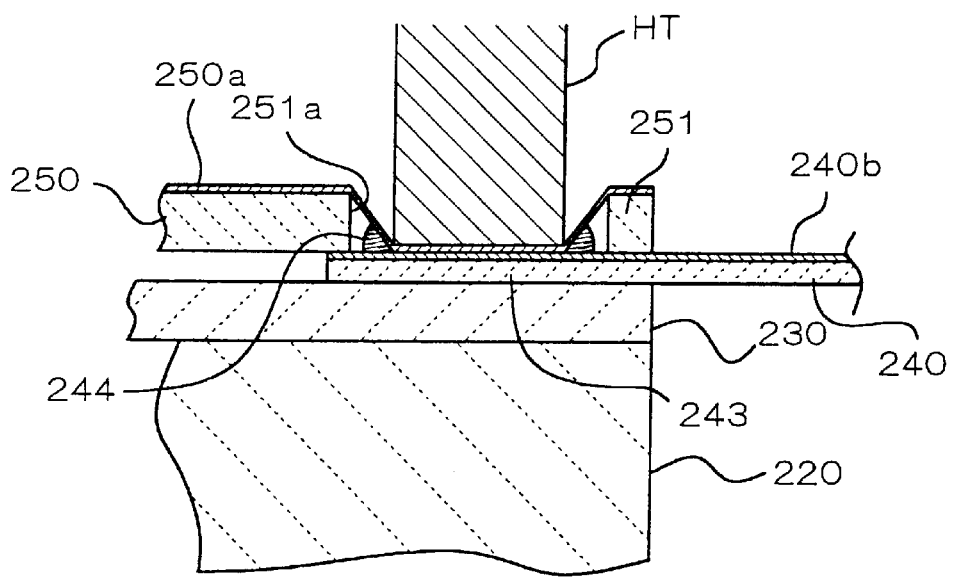

FIG. 10 shows the step of connecting the input terminal 243 of the flexible wiring substrate 240 to the output terminal 251 of the circuit wiring substrate 250. FIG. 10(a) shows the state before soldering, and FIG. 10(b) shows the state after soldering.

In this embodiment, the lead-free solder 244 is previously pre-coated on one of the input terminal 243 of the flexible wiring substrate 240 and the output terminal 251 of the circuit wiring substrate 250 in the same manner as the first embodiment. FIG. 10(a) shows the state in which the lead-free solder 244 is arranged on the input terminal 243. The input terminal 243 of the flexible wiring substrate 240 is inserted between the light diffusing layer 230 and the circuit wiring substrate 250.

Next, as shown in FIG. 10(b), the pressure bonding member HT is moved downward to press the terminals of the wirings 250a on the lead-free solder 244 coated on the wirings 240b under heating. As a result, the lead-free solder 244 is melted, and then solidified by removing the pressure bonding member HT to fix the terminals of the wirings 240b and the terminals of the wirings 250a in a state of conductive connection.

The light diffusing layer 230 functions as a heat insulating material for decreasing heat transmission from the connection region, which is connected with the lead-free solder 244, to prevent thermal deformation or thermal deterioration of the frame 220 in the same manner as the first embodiment. Although the light diffusing layer 230 can be made of the same material as the first embodiment, particularly, it is preferably made of a material having a higher heat insulating property (lower thermal conductivity) than the insulating base material of the flexible wiring substrate 240 arranged nearer to the frame 220 than the connection region. This is because the thickness of the light diffusing layer need not be excessively increased in order to obtain the heat insulating effect.

The light diffusing layer 230 can be caused to also function as a bonding layer or adhesive layer between the light diffusing layer 230 and the circuit wiring substrate 250.

In this embodiment, the same light reflecting layer 121 as the second embodiment may be arranged instead of the light diffusing layer 230, and a heat insulating material may be temporarily inserted between the light reflecting layer 121 and the circuit wiring substrate 250, followed by the soldering.

In this embodiment, the light diffusing layer 230 having the heat insulating function is arranged between the connection region between the flexible wiring substrate 240 and the circuit wiring substrate 250 and the frame 220. However, the heat insulating function of the heat insulating material is particularly effective when the thickness of the insulating base material of the flexible wiring substrate 240 arranged nearer to the frame 220 than the connection region is about 50 μm or less.

Figure 11:
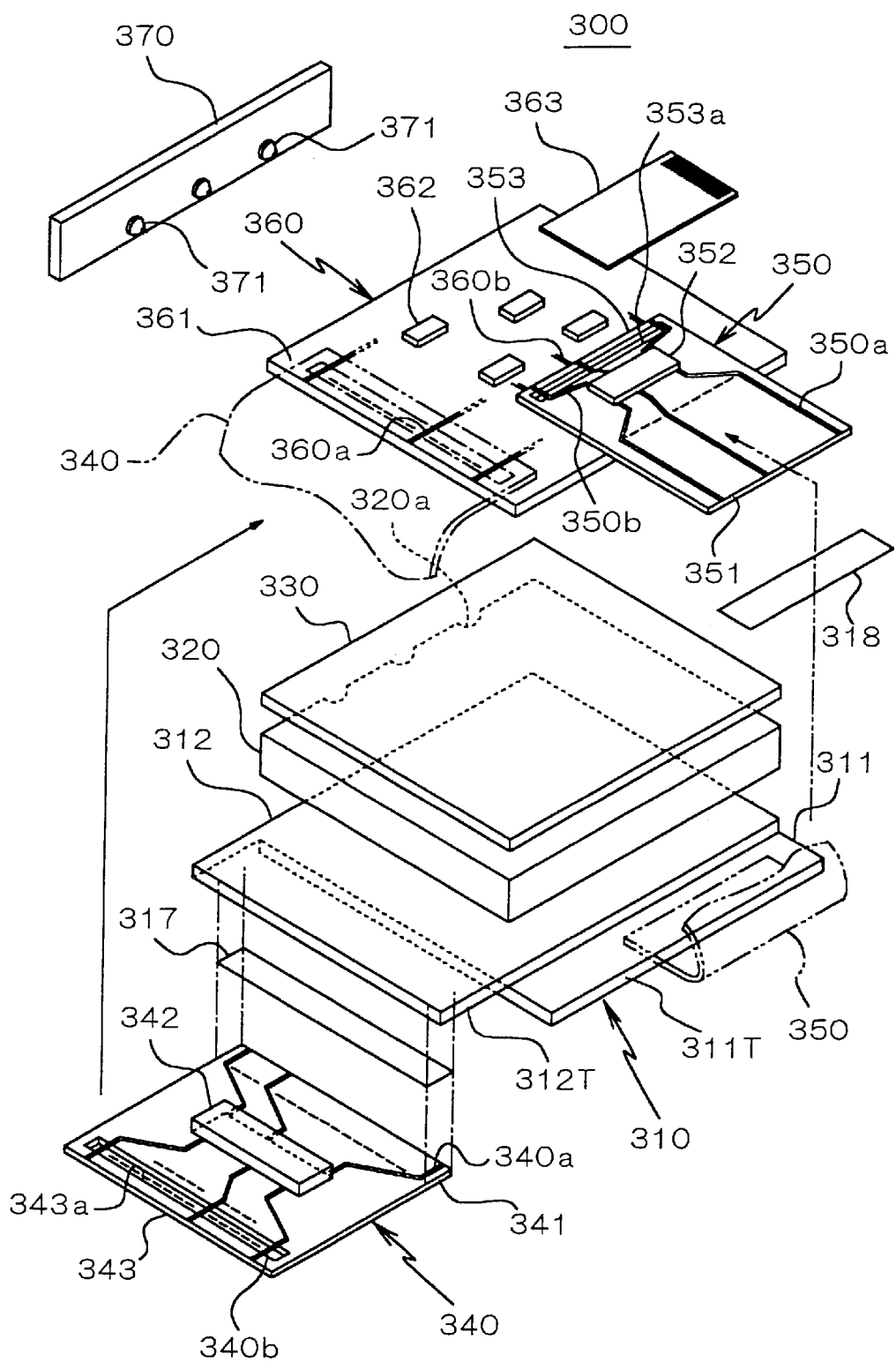
FIG. 11 is an exploded perspective view showing the structure of a liquid crystal device according to a fourth embodiment of the present invention.
Figure 12:
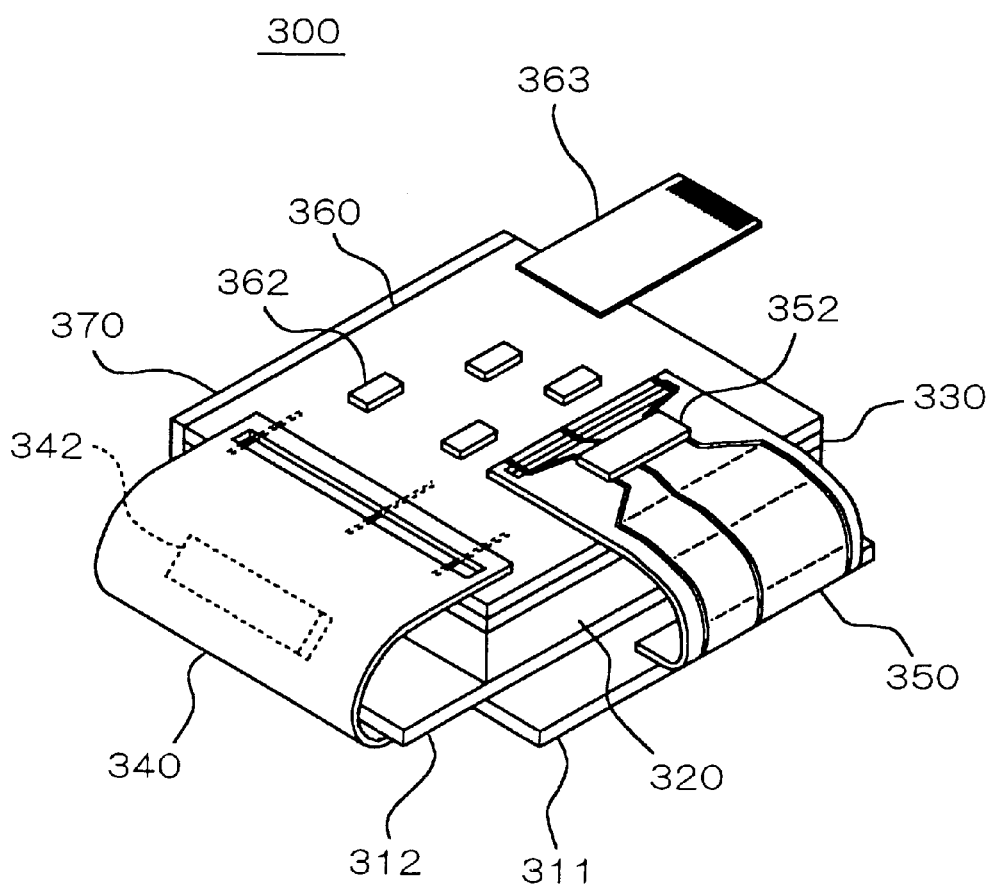
FIG. 12 is a schematic perspective view showing the assembly state of the liquid crystal device of the fourth embodiment.

A liquid crystal device 300 in accordance with a fourth embodiment of the present invention will be described below with reference to FIGS. 11 and 12. FIG. 11 is an exploded perspective view showing the structure of the liquid crystal device 300, and FIG. 12 is a schematic perspective view showing the assembly state of the liquid crystal device 300.

The liquid crystal device 300 comprises a liquid crystal panel 310 comprising a first substrate 311 and a second substrate 312 which are combined together with a sealing material (not shown in the drawings), and a liquid crystal not shown in the drawing and sealed between the substrates, a frame 320 arranged to overlap with the liquid crystal panel 310, a light reflecting plate 330 arranged to overlap with the frame 320, a circuit wiring substrate 360 arranged to overlap with the light reflecting plate 330, a flexible wiring substrate 340 mounted on the liquid crystal panel 310 and the circuit wiring substrate 360, a flexible wiring substrate 350 mounted on the liquid crystal panel 310 and the circuit wiring substrate 360, and a sub-substrate 370 attached to an end of the circuit substrate 360.

The second substrate 312 of the liquid crystal panel 310 comprises a substrate projected portion 312T provided to project outward from the outer shape of the first substrate 311, and a plurality of wirings not shown in the drawing and formed on the substrate projected portion 312T are conductively connected to the terminals of the wirings 340a of the flexible wiring substrate 340 through the same anisotropic conductive film 317 as each of the above embodiments. A liquid crystal driving IC 342 is mounted on the flexible wiring substrate 340 so as to be conductively connected to the wirings 340a, and conductively connected to the wirings 340b separately formed. The wirings 340b are conductively connected to the wirings 360b of the circuit wiring substrate 360 with solder (not shown).

The first substrate 311 of the liquid crystal panel 310 also comprises a substrate projected portion 311T projected outward from the outer shape of the second substrate 312, and a plurality of wirings not shown in the drawing and formed on the substrate projected portion 311T are conductively connected to the wirings 350a of the flexible wiring substrate 350 through an anisotropic conductive film 318 in the same manner as the substrate projected portion 312T. A liquid crystal driving IC 352 is mounted on the flexible wiring substrate 350 so as to be conductively connected to the wirings 350a, and conductively connected to the wirings 350b separately formed. The wirings 350b are conductively connected to the wirings 360a of the circuit wiring substrate 360 with solder (not shown).

The substrate projected portions 311T and 312T are provided at the adjacent two perpendicular edges of the liquid crystal panel 310 having a rectangular planar shape. The flexible wiring substrates 340 and 350 are formed to be connected to the circuit wiring substrate 360 from adjacent two perpendicular edge sides (i.e., two different directions) of the liquid crystal panel 310. The liquid crystal panel is not limited to the above-described case in which the substrate projected portions are respectively provided on a pair of substrates, and the substrate projected portions may be provided on only one of the substrates so as to extend to the above-described two side edges On the circuit wiring substrate 360, a predetermined wiring pattern including the wirings 360a and 360b is formed, and an electronic parts 362 such as IC, chip parts and the like are mounted. Also, a flexible wiring substrate 363 for external connection is mounted on the circuit wiring substrate 360.

Furthermore, the sub-substrate 370 comprising the same insulating base material as the circuit wiring substrate 360 and a predetermined wiring pattern provided on the insulating base material is connected to the end of the circuit wiring substrate 360. On the sub-substrate 370, one or a plurality (in the example shown in the drawing, three) of light emitting devices 371 comprising LED or the like are mounted. The light emitting devices 371 are provided to be contained in the light incidence recesses 320a formed in a concave shape at an end surface of the frame 320 when the sub-substrate 370 is connected to the end of the circuit wiring substrate 360.

As described above in the first to third embodiments, the light emitted from the light emitting devices 371 is incident on the frame 320 having a light guide function, and the light reflecting plate 330 has the function to reflect or scatter, toward the liquid crystal panel 310, the light leaking from the frame 320 to the circuit wiring substrate 360 side. The light reflecting plate 330 also comprises a material having relatively high heat insulating property (material having low thermal conductivity). The light reflecting plate 330 can be formed by depositing an aluminum layer on the frame-side surface of a base material of silicone rubber, fluororesin (polytetrafluoroethylene, polychlorotrifluoroethylene, or the like), fluorocarbon rubber (a copolymer of vinylidene fluoride and hexafluoropropylene), or attaching a polycarbonate film exhibiting a white color to the surface.

Figure 13:
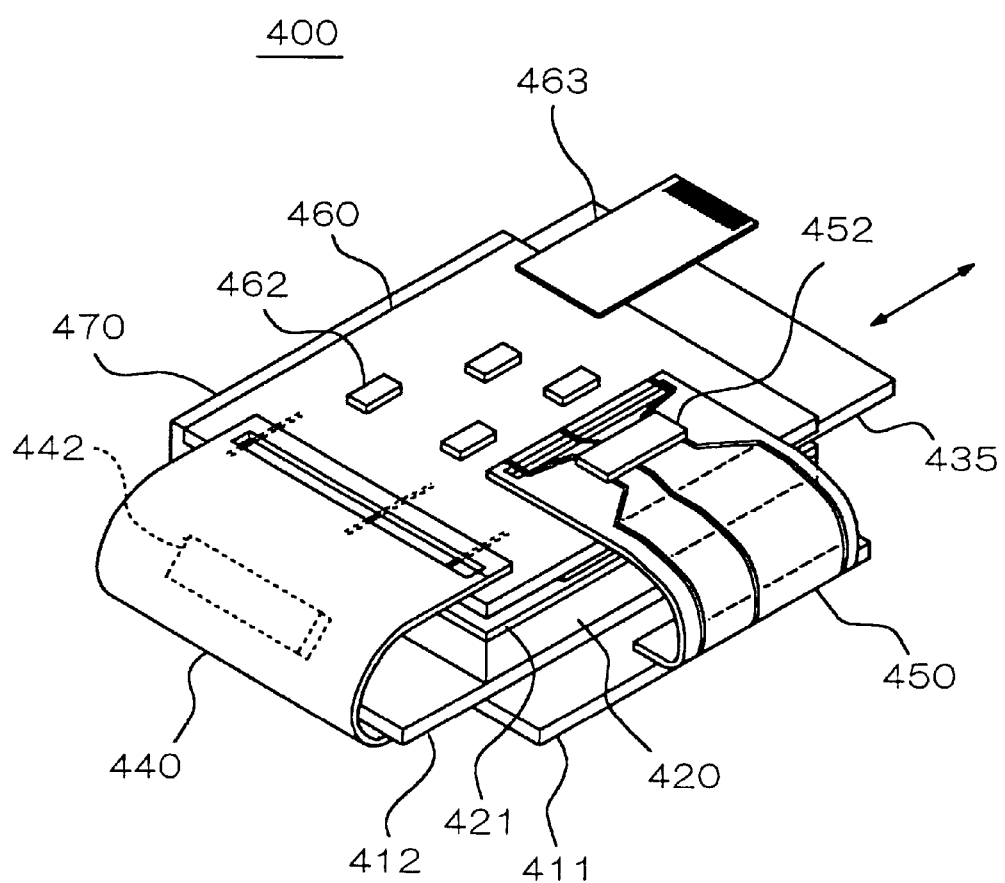
FIG. 13 is a schematic perspective view showing the assembly state of a liquid crystal device according to a fifth embodiment of the present invention.

A liquid crystal device 400 according to a fifth embodiment of the present invention will be described with reference to FIG. 13. The liquid crystal device 400 comprises a liquid crystal panel comprising a first substrate 411 and a second substrate 412 both of which are the same as the fourth embodiment, a frame 420 arranged to overlap with the liquid crystal panel, a light reflecting layer 421 having the same construction as the second embodiment, two flexible wiring substrates 440 and 450 mounted on the liquid crystal panel in the same manner as the fourth embodiment, the same circuit wiring substrate 460 as the fourth embodiment connected to the flexible wiring substrates 440 and 450, and the same sub-substrate 470 as the fourth embodiment. In this embodiment, liquid crystal driving ICs 442 and 452, electronic parts 462, a flexible wiring substrate 463 are the same as the fourth embodiment.

Although, in the fourth embodiment, the light reflecting plate has both the light reflecting function and the heat insulating function, in the fifth embodiment, the same light reflecting layer as the second embodiment is provided, and a heat insulating material 435 is separately provided. The heat insulating material 435 comprises the same material as the second embodiment, and is inserted between the circuit wiring substrate 460 and the light reflecting layer 421. The flexible wiring substrates 440 and 450 are soldered to the circuit wiring substrate 460 by the same method as the fourth embodiment with the heat insulating material 435 being inserted below the circuit wiring substrate 460. After the completion of soldering, the heat insulating material 435 is removed by drawing out as shown in FIG. 13.

Figure 14:
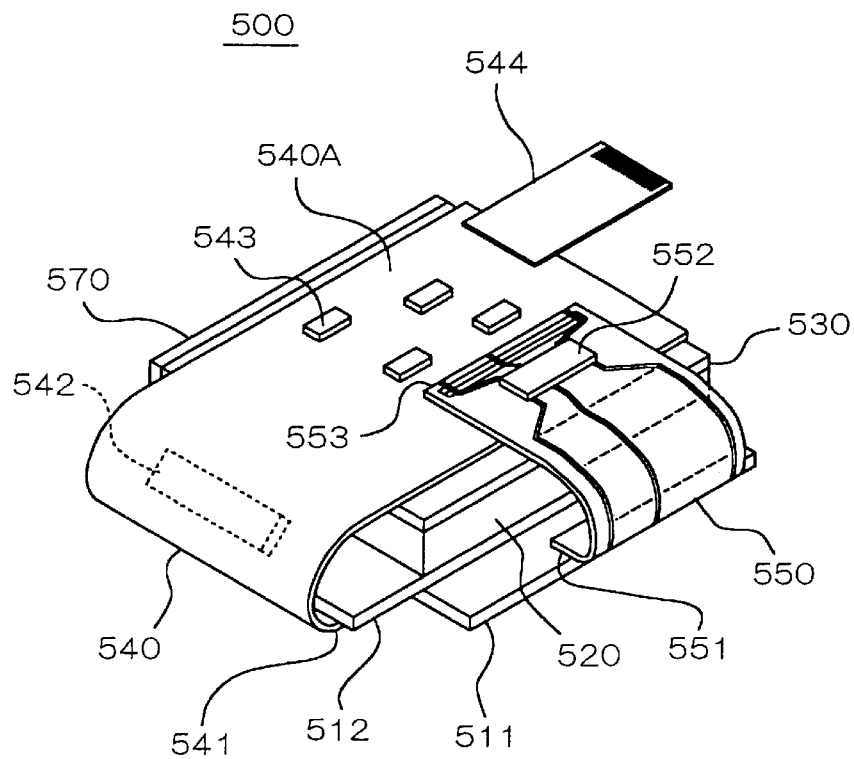
FIG. 14 is a schematic perspective view showing the assembly state of a liquid crystal device according to a sixth embodiment of the present invention.

A liquid crystal device 500 according to a sixth embodiment of the present invention will be described with reference to FIG. 14. The liquid crystal device 500 of this embodiment comprises the same liquid crystal panel as the fourth or fifth embodiment, which comprises a first substrate 511 and a second substrate 512, a frame 520 arranged to overlap with the liquid crystal panel, the same light reflecting plate as the fourth embodiment, a flexible wiring substrate 540 mounted on a substrate projected portion of the second substrate 512 of the liquid crystal panel, and a flexible wiring substrate 550 mounted on a substrate projected portion of the first substrate 511.

The flexible wiring substrate 540 has a bent shape and is extended from an output terminal 541 mounted on the second substrate 512 to a the light reflecting plate 530, a liquid crystal driving IC 542 being mounted on the inner surface of the bent portion. Also, a circuit forming portion 540A is provided at the end of the bent portion so as to overlap with the light reflecting plate 530. The same electronic parts 543 as the fourth embodiment are mounted on the circuit forming portion 540A, and the flexible wiring substrate 550 mounted on the substrate projected portion of the first substrate 511 is connected to the circuit forming portion 540A. Furthermore, the same flexible wiring substrate 544 as the fourth embodiment is mounted on the circuit forming portion 540A.

The flexible wiring substrate 550 has a bent shape and is extended from the output terminal 551 mounted on the substrate projected portion of the first substrate 511 to the circuit forming portion 540A of the flexible wiring substrate 540, a liquid crystal driving IC 552 being mounted on the outer surface of the flexible wiring substrate 550. Also, an input terminal 553 is connected to the circuit forming portion 540A with solder.

In this embodiment, the light reflecting plate 530 can isolate the circuit forming portion 540A of the flexible wiring substrate 540 from heat produced in connection (soldering) of the input terminal 553 of the flexible wiring substrate 530, thereby preventing thermal deformation or thermal deterioration of the frame 520.

In each of the above-described fourth to sixth embodiments, the flexible wiring substrates are formed in a bent shape to extend toward the back (the side opposite to the observation side) of the frame from adjacent two perpendicular side edges of the liquid crystal panel having a rectangular planar shape. However, for example, the flexible wiring substrates may be formed in a bent shape so as to extend to the back of the frame from opposite two parallel side edges, and a plurality of flexible wiring substrates may be provided to extend from appropriate positions. In this case, as in the fourth and fifth embodiments, when a plurality of flexible wiring substrates are connected to a common circuit wiring substrate in different directions, the flexible wiring substrates cannot be physically connected (soldered) to the circuit wiring substrate at positions not overlapping with the frame. Therefore, the construction of the present invention is effective for such a case.

Unlike in the fourth to sixth embodiments, the number of the flexible wiring substrates connected so as to extend to the back of the frame need not be 2, and at least three flexible wiring substrates may be provided.

Furthermore, like in the sixth embodiment, in the structure in which one flexible wiring substrate is connected to another flexible substrate at the back of a frame, the effect of the present invention can be obtained.

Figure 15:
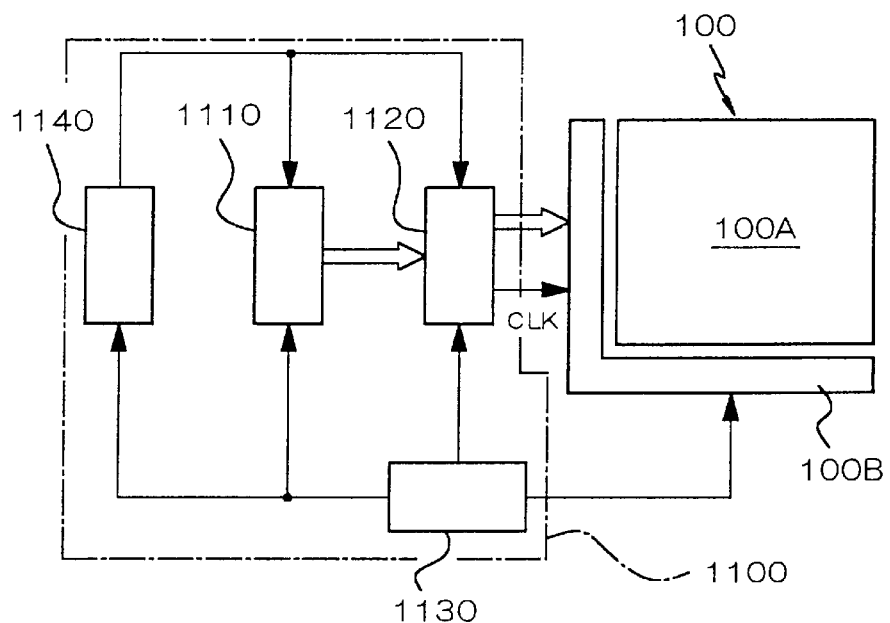
FIG. 15 is a schematic block diagram showing the circuit configuration of an electronic apparatus according to a seventh embodiment of the present invention.

An electronic apparatus using the above-described liquid crystal device according to an embodiment of the present invention will be described with reference to FIGS. 15 and 16. FIG. 15 is a schematic block diagram showing the construction of a display system of this embodiment. The electronic apparatus shown in FIG. 15 comprises the liquid crystal device (a liquid crystal device 100 as a typical example) of any one of the above embodiments, modified embodiments and construction examples, and a display control circuit 1100 for controlling the liquid crystal device serving as a display device.

The liquid crystal device 100 comprises a panel body 100A including a liquid crystal panel, and a polarizer, a back light, etc. attached thereto, and a driving circuit 100B for driving the liquid crystal panel. The driving circuit 100B comprises the liquid crystal driving IC mounted on the liquid crystal panel of any one of the above embodiments, modified embodiments and construction examples.

The display control circuit 1100 comprises a display information output source 1110, a display processing circuit 1120, a power supply circuit 1130 and a timing generator 1140.

The display information output source 1110 comprises a memory comprising ROM (Read Only Memory), RAM (Random Access Memory), or the like, a storage unit comprising a magnetic recording disk, an optical recording disk, or the like, and a tuning circuit for synchronizing and outputting digital image signals so that on the basis of any of various clock signals produced by the timing generator 1140, display information is supplied in the form of an image signal in a predetermined format to the display information processing circuit 1120.

The display information processing circuit 1120 comprises various known circuits such as a serial-parallel converter circuit, an amplifying-inverting circuit, a rotation circuit, a gamma-correction circuit, a clamping circuit, etc., for processing the input display information to supply image information to the driving circuit 100B together with the clock signal CLK. The driving circuit 100B includes a scanning line driving circuit, a data line driving circuit and an inspection circuit. The power supply circuit 1130 supplies a predetermined voltage to each of the components.

Figure 16:
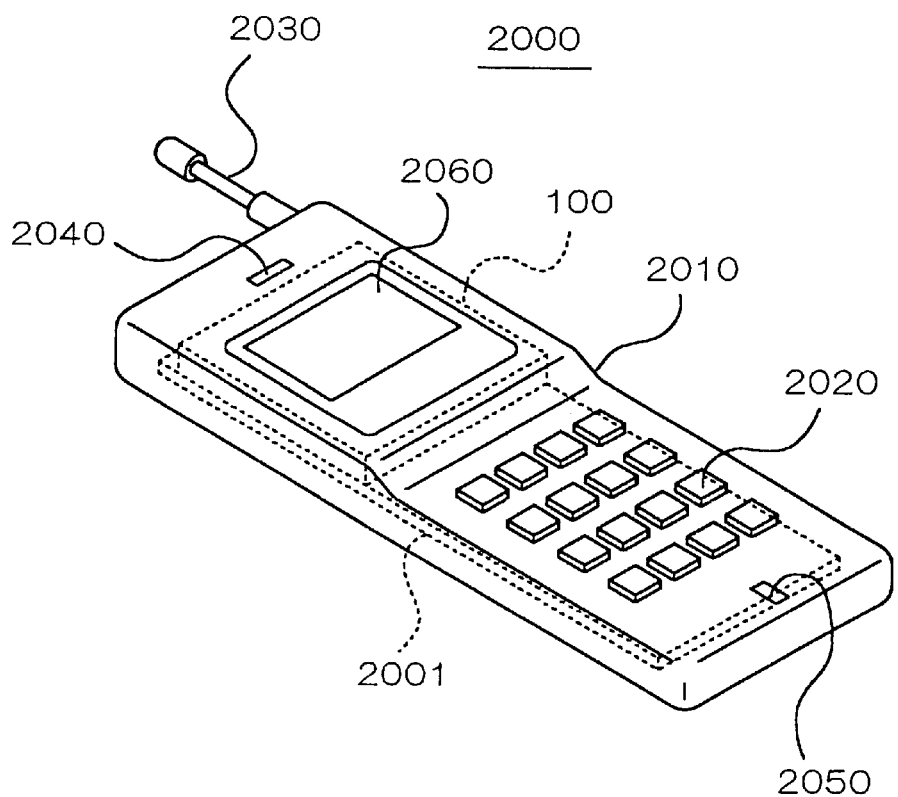
FIG. 16 is a schematic perspective view showing the appearance of a cellular phone as an example of the configuration of the seventh embodiment.

FIG. 16 shows a cellular phone as an example of an electronic apparatus according to this embodiment. The cellular phone 2000 shown in FIG. 16 comprises a circuit substrate 2001 provided in a case body 2010, and a liquid crystal device mounted on the circuit substrate 2001 and comprising the above-described panel body 100A and the driving circuit 100B. Also, operating buttons 2020 are arranged on the front of the case body 2010, and an antenna 2030 provided at one end of the case body 2010 so that it can be freely set up and stowed away. A receiving portion 2040 contains a speaker arranged therein, and a transmitting portion 2050 contains a microphone.

The panel body 100A provided in the case body 2010 is constructed so that the display surface (a liquid crystal driving region formed inside the sealing material) can be visually seen through a display window 2060.

The electro-optical device, the method of manufacturing an electro-optical device, the light guide, the liquid crystal device, the method of manufacturing a liquid crystal device, and the electronic apparatus of the present invention are not limited to the above-mentioned embodiments shown in the drawings, and of course various modifications can be made within the scope of the gist of the present invention. For example, with respect to the construction of the liquid crystal device, the present invention can be applied to not only the above-described transmissive liquid crystal device but also a reflective liquid crystal device and a transflective liquid crystal device. The present invention can be widely applied to not only a dot matrix-type liquid crystal device but also various liquid crystal devices such as a segment-type liquid crystal device, and the like.

Although, the construction of the liquid crystal device is described above, the present invention can also be applied to various electro-optical devices each having at least one electro-optical panel substrate, such as an electroluminescence device, an organic electroluminescence device, a plasma display device.

Although, in each of the above embodiments, one liquid crystal driving IC is mounted on each of the flexible wiring substrates, a plurality of electronic parts such as IC chips, chip-shaped parts, and the like may be mounted on each of the flexible wiring substrates.

Although, in each of the above embodiments, connection using lead-free solder is described, lead-containing solder and other various bonding metals can be used.

Examples of the electronic apparatus of the present invention include the above-described cellular phone, a portable information terminal, an electronic notebook, a video camera (comprising an electronic apparatus used as a finder), and the like.

As described above, in the present invention, a heat insulating layer is provided between a connection region and a frame to suppress heat transmission to the frame during conductive connection between a first wiring substrate and a second wiring substrate with a bonding metal, thereby preventing thermal deformation or thermal deterioration of the frame. Providing the heat insulating layer prevents heat transmission from the connection region between the first wiring substrate and the second wiring substrate to the frame to facilitate heating of the bonding metal, thereby facilitating a connecting work using the bonding metal and improving the quality of the connection state of the correction region.

What is claimed is:

1. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

applying heat to a connection region between the first wiring substrate and the second wiring substrate with a heat insulating layer provided between the connection region and the frame to conductively connect the first wiring substrate to the second wiring substrate;

wherein the heat insulating layer diffuses light emitted from the frame.

2. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

applying heat to a connection region between the first wiring substrate and the second wiring substrate with a heat insulating layer provided between the connection region and the frame to conductively connect the first wiring substrate to the second wiring substrate;

wherein the one of the first wiring substrate and the second wiring substrate that is provided nearer to the frame than the connection region has a thickness of about 100 $\mu$m or less.

3. The method of manufacturing an electro-optical device according to claim 2, wherein the first wiring substrate is conductively connected to the second wiring substrate with a bonding metal.

4. The method of manufacturing an electro-optical device according to claim 2, wherein the one of the first wiring substrate and the second wiring substrate that is provided nearer to the frame than the connection region has a thickness of about 50 $\mu$m or less.

5. The method of manufacturing an electro-optical device according to claim 3, wherein the bonding metal comprises lead-free solder.

6. The method of manufacturing an electro-optical device according to claim 5, wherein the lead-free solder comprises an alloy selected from the group consisting of Sn—Ag—Cu system, Sn—Ag—Bi—Cu system, Sn—Ag system, Sn—Cu system, Sn—Bi system, and Sn—Zn system alloys.

7. The method of manufacturing an electro-optical device according to claim 2, wherein the frame comprises a synthetic resin material.

8. The method of manufacturing an electro-optical device according to claim 2, wherein the heat insulating layer contains a material selected from the group consisting of silicone rubber, polytetrafluoroethylene, polychlorotrifluoroethylene, and fluorocarbon rubber.

9. The method of manufacturing an electro-optical device according to claim 2, wherein a plurality of the first wiring substrates are connected to the second wiring substrate in different directions.

10. The method of manufacturing an electro-optical device according claim 2, wherein a plurality of the first wiring substrates are connected to the second wiring substrate from different side edges of the second wiring substrate, the second wiring substrate having a peripheral shape including a plurality of side edges.

11. The method of manufacturing a liquid crystal device according claim 2, wherein the electro-optical panel further comprises a liquid crystal panel.

12. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

applying heat to a connection region between the first wiring substrate and the second wiring substrate with a heat insulating layer provided between the connection region and the frame to conductively connect the first wiring substrate to the second wiring substrate;

wherein the heat insulating layer has lower thermal conductivity than the base material of the one of the first and second wiring substrate that is arranged nearer to the frame than the connection region.

13. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

applying heat to a connection region between the first wiring substrate and the second wiring substrate with a heat insulating layer provided between the connection region and the frame to conductively connect the first wiring substrate to the second wiring substrate;

wherein the second wiring substrate is bonded to the frame by the heat insulating layer receiving heat during conductive connection between the first wiring substrate and the second wiring substrate.

14. The method of manufacturing an electro-optical device according to claim 13, wherein the heat insulating layer is thermally cured by heating during conductive connection between the first wiring substrate and the second wiring substrate to bond the second wiring substrate to the frame.

15. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

applying heat to a connection region between the first wiring substrate and the second wiring substrate with a heat insulating layer provided between the connection region and the frame to conductively connect the first wiring substrate to the second wiring substrate; and removing the heat insulating layer after conductive connection between the first wiring substrate and the second wiring substrate.

16. A method of manufacturing an electro-optical device including an electro-optical panel, a first wiring substrate mounted to the electro-optical panel, a second wiring substrate connected to the first wiring substrate, and a frame arranged between the electro-optical panel and the second wiring substrate, the method comprising:

arranging a heat insulating layer between a connection region where the first wiring substrate is connected to the second wiring substrate and the frame;

arranging a light diffusing layer between the heat insulating layer and the frame; and applying heat to the connection region to conductively connect the first wiring substrate to the second wiring substrate.

* * * * *